(12) United States Patent
Lee (10) Patent No.: US 8,363,497 B2
(45) Date of Patent: Jan. 29, 2013

(54) DATA CONTROL CIRCUIT

(75) Inventor: Sang Kwon Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 324 days.

(21) Appl. No.: 12/649,475

(22) Filed: Dec. 30, 2009

(65) Prior Publication Data

US 2011/0026344 A1    Feb. 3, 2011

(30) Foreign Application Priority Data

Jul. 31, 2009   (KR) ................. 10-2009-0070761

(51) Int. Cl.
*G11C 7/00*   (2006.01)
(52) U.S. Cl. ...................................... 365/203
(58) Field of Classification Search .............. 365/203
See application file for complete search history.

(56) References Cited

U.S. PATENT DOCUMENTS

| 5,910,924 | A | * | 6/1999 | Tanaka et al. ............... 365/226 |
| 7,570,542 | B2 | | 8/2009 | Lee | |
| 2004/0095825 | A1 | * | 5/2004 | Tanizaki et al. ............ 365/207 |
| 2008/0239849 | A1 | * | 10/2008 | Do ............................... 365/205 |

FOREIGN PATENT DOCUMENTS

| KR | 1020030026010 A | 3/2003 |
| KR | 1020080029309 A | 4/2008 |

* cited by examiner

*Primary Examiner* — Anthan Tran
(74) *Attorney, Agent, or Firm* — Ladas & Parry LLP (57) ABSTRACT

The data control circuit includes an input/output line and a driver. The input/output line precharging circuit precharges a global input/output line to a predetermined voltage when either a reading operation or a writing operation is inoperative. The driver includes a number of MOS transistors and drives the global input/output line in response to receiving data from a local input/output line and a complementary local input/output line during the reading operation.

28 Claims, 6 Drawing Sheets

DATA CONTROL CIRCUIT

CROSS-REFERENCE TO RELATED APPLICATIONS

The present application claims priority under 35 U.S.C 119(a) to Korean Application No. 10-2009-0070761, filed on Jul. 31, 2009, in the Korean Intellectual Property Office, which is incorporated by reference in its entirety as set forth in full.

BACKGROUND

Along with the continuous advancement of computing systems and electronic communications, semiconductor memories which are used in reserving information are becoming cheaper to product, smaller in size, and larger in data capacities. Moreover, the ever-growing demand for energy efficiency, is now driving semiconductor memories to be operated with considerably less current consumption than before.

In the meantime, a dynamic random access memory (DRAM) has various types of drivers for conducting reading and writing operations. For example, reading operations of DRAMs can be executed by using input/output line sense-amplifier drivers for driving global input/output lines to accept data from a local input/output lines. The writing operations of DRAMs need data input drivers for driving the global input/output lines to receive input data from DQ pads.

Those drivers that are built within DRAMs are generally made up of metal-oxide-semiconductor (MOS) transistors. Since the current characteristics performance of MOS transistors drops down greatly under low power voltage (VDD) conditions, then current drivability performance is prone to degrading. For this reason, those MOS transistors drivers powered by low power conditions must be configured to be larger than others in the DRAM, in order to assure stable drivability.

However, when the reading or writing operations are not needed, e.g., when in power down modes, leakage current can still flow through these MOS transistors of the drivers that are shut down. Therefore, a larger size of the MOS transistor for needed for achieving higher drivability in low power voltage conditions can result in causing an increase in leakage current.

SUMMARY

Accordingly, there is provided a data control circuit capable of reducing leakage current by precharging a global input/output line when there are no reading or writing operations.

In accordance with an aspect of the present invention, there is provided a data control circuit may be comprised of: an input/output line precharging circuit configured to precharge a global input/output line to a predetermined voltage when a reading or writing operation is inoperative; and a driver comprising a number of MOS transistors and configured to drive the global input/output line in response to receiving data from a local input/output line and a complementary local input/output line during the reading operation. One of the MOS transistors, which drives the global input/output line, has a threshold voltage lower than threshold voltages of the others of the MOS transistors.

In accordance with another aspect of the present invention, there is provided a data control circuit may be comprised of: a first input/output line precharging circuit configured to precharge a first global input/output line to a predetermined voltage when a reading or writing operation is inoperative; a second input/output line precharging circuit configured to precharge a second global input/output line to a predetermined voltage when the reading or writing operation is inoperative; and a repeater configured to amplify and transfer data of the first global input/output line to the second global input/output line during the reading operation and configured to amplify and transfer data of the second global input/output line to the first global input/output line during the writing operation.

In accordance with another aspect of the present invention, there is provided a data control circuit may be comprised of: an input/output line precharging circuit configured to precharge a global input/output line at a predetermined voltage when a reading or writing operation is inoperative; and a driver comprising a number of MOS transistors and configured to drive the global input/output line in response to receiving data from a data pad during the writing operation. One of the MOS transistors, which drives the global input/output line, has a threshold voltage lower than threshold voltages the others of the MOS transistors.

In accordance with another aspect of the present invention, there is provided a data control circuit may be comprised of: an input/output line precharging circuit configured to precharge first and second global input/output lines at a predetermined voltage when a reading or writing operation is inoperative; a first driver configured to drive the first global input/output line in response to receiving data from a local input/output line and a complementary local input/output line during the reading operation; a repeater configured to amplify and transfer data of the first global input/output line to the second global input/output line in the reading operation and configured to amplify and transfer data of the second global input/output line to the first global input/output line in the writing operation; and a second driver configured to drive the second global input/output line in response to receiving data from a data pad during the writing operation.

A further understanding of the nature and advantages of the present invention herein may be realized by reference to the remaining portions of the specification and the attached drawings.

BRIEF DESCRIPTION OF THE DRAWINGS

The above and other aspects, features and other advantages will be more clearly understood from the following detailed description taken in conjunction with the accompanying drawings, in which.

DESCRIPTION OF EMBODIMENTS

Hereinafter, various embodiments will now be described more fully with reference to the accompanying drawings in which some embodiments are shown. However, specific structural and functional details disclosed herein are merely representative for purposes of describing embodiments of the present invention. Like numbers refer to like elements throughout the description of the drawings.

The terminology used herein is for the purpose of describing particular embodiments only and is not intended to be limiting of embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Further, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention. As used herein, the term "and/or" includes any and all combinations of one or more of the associated listed items. Also will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In order to more specifically describe embodiments, various parameters and embodiments will be hereinafter described in detail with reference to the attached drawings.

Figure 1:
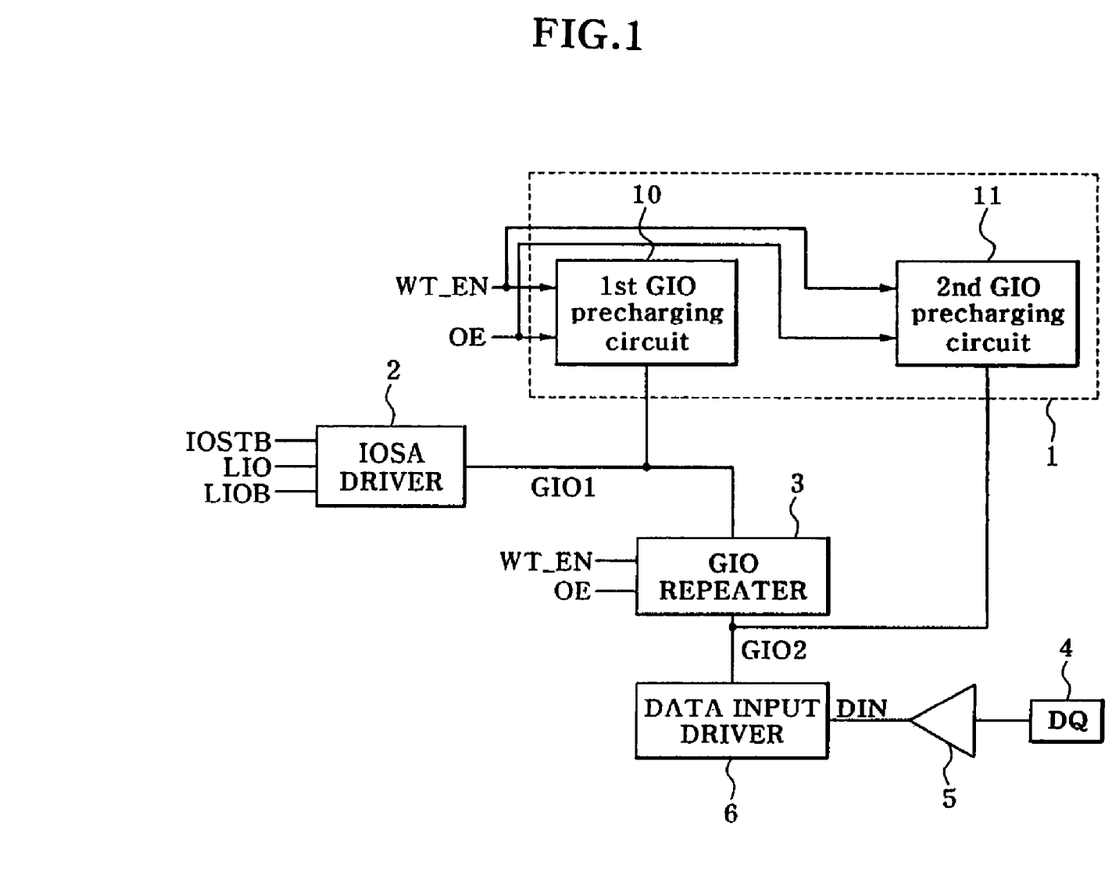
FIG. 1 is a block diagram illustrating a functional configuration of a data control circuit according to an embodiment of the present invention.

FIG. 1 illustrates a functional block configuration of a data control circuit according to an embodiment of the present invention.

Referring to FIG. 1, the data control circuit may comprise an input/output line (IO) precharging circuit 1, an input/output line sense-amplifier (IOSA) driver 2, a global input/output line (GIO) repeater 3, a data pad (DQ) 4, a data buffer 5 and a data input driver 6. The input/output line precharging circuit 1 is exemplarily composed of a first global input/output line precharging circuit 10 and a second global input/output line precharging circuit 11.

Figure 2:
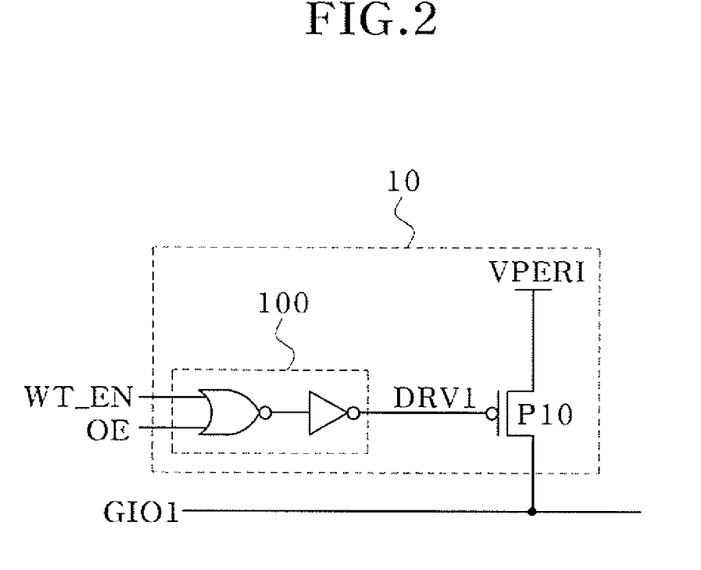
FIG. 2 is a circuit diagram illustrating the first global input/output line precharging circuit of the data control circuit shown in FIG. 1.

Referring now to FIG. 2, the first global input/output line precharging circuit 10 may be formed of a first drive signal generator 100 and a PMOS transistor P10. The first drive signal generator 100 is configured to generate a first drive signal DRV1 through an OR operation when responding to a first enable signal OE, and a second enable signal WT_EN. The first enable signal OE is activated as a high level state when in a reading operation. The second enable signal WT_EN is activated as a high level state when in a writing operation. The PMOS transistor P10 is turned on to drive a first global input/output line GIO1 at an internal voltage VPERI in response to the first drive signal DRV1 when the first drive signal DRV1 in a low level state. With this configuration, the first global input/output line precharging circuit 10 operates to drive the first global input/output line GIO1 at the internal voltage VPERI when the reading and writing operations are inoperative.

Figure 3:
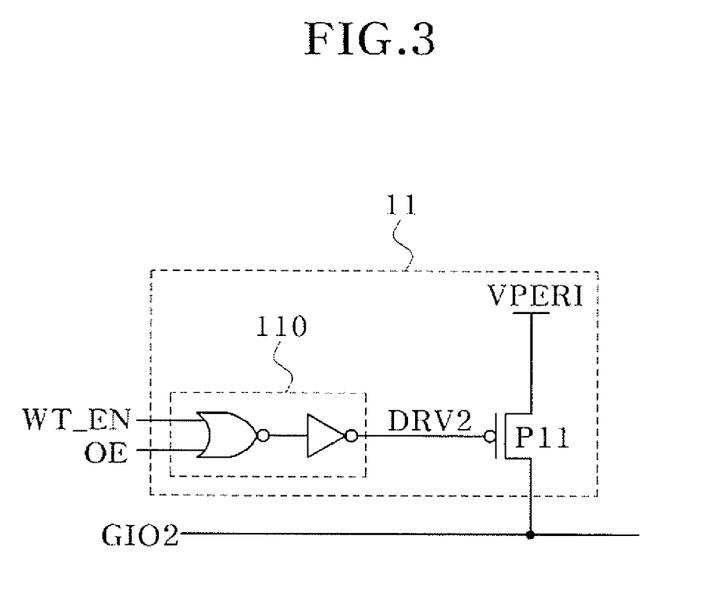
FIG. 3 is a circuit diagram illustrating the second global input/output line precharging circuit of the data control circuit shown in FIG. 1.

Referring to FIG. 3, the second global input/output line precharging circuit 11 may be formed of a second drive signal generator 110 and a PMOS transistor P11. The second drive signal generator 110 is configured to generate a second drive signal DRV2 through an OR operation in response to receiving the first and second enable signals OE and WT_EN. The PMOS transistor P11 is turned on to drive a second global input/output line GIO2 at the internal voltage VPERI in response to the second drive signal DRV2 when the second drive signal DRV2 is in a low level state. With this configuration, the second global input/output line precharging circuit 11 operates to drive the second global input/output line GIO2 at the internal voltage VPERI when the reading and writing operations are inoperative.

Figure 4:
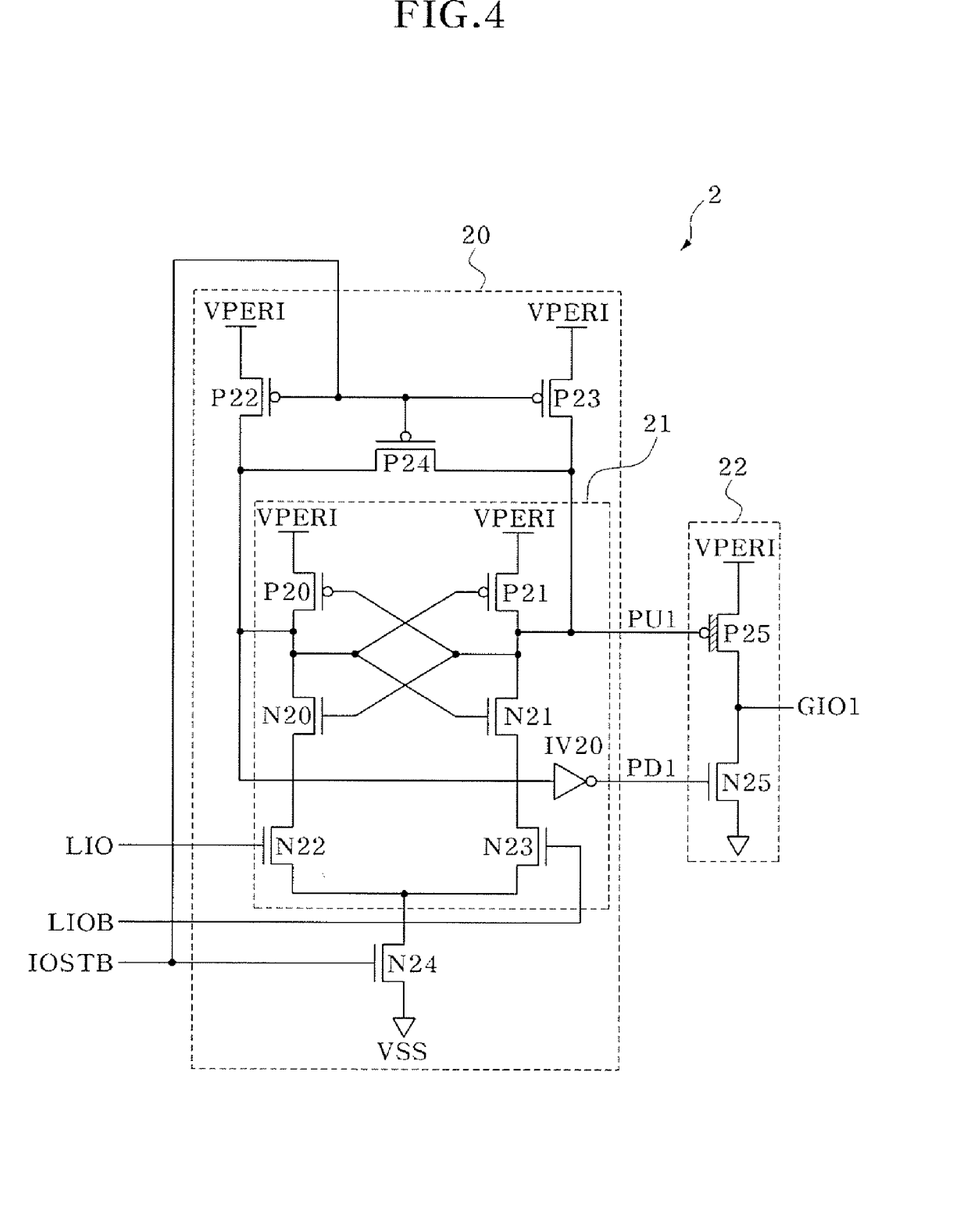
FIG. 4 is a circuit diagram illustrating the global input/output line repeater of the data control circuit shown in FIG. 1.

Referring next to FIG. 4, the input/output line sense-amplifier driver (hereinafter, referred to as "IOSA driver") 2 may comprise a first pull-up/down signal generator 20 and a first driving circuit 22.

The first pull-up/down signal generator 20 is exemplarily formed of a first differential amplifier 21, and PMOS and NMOS transistors P22~P24 and N24 that function to enable the first differential amplifier 21 in response to a strobe signal IOSTB. The first differential amplifier 21 may be formed of PMOS transistors, P20 and P21, and NMOS transistors N20~N23. The first differential amplifier 21 generates a first pull-up signal PU1 and a first pull-down signal PD1 by differentially amplifying data from a local input/output line LIO and a complementary local input/output line LIOB. With this configuration, the first differential amplifier 21 is enabled when the strobe signal IOSTROB is activated at a high level state. When the local input/output line LIO is set on a high level state, the first differential amplifier 21 generates the first pull-up and pull-down signals PU1 and PD1 that are activated at low level states. To the contrary, when the local input/output line LIO is set on a low level state, the first pull-up and pull-down signals PU1 and PD1 are generated on high level states from the first differential amplifier 21.

The first driving circuit 22 may be formed of a PMOS transistor P25 and an NMOS transistor N25. The PMOS transistor P25 drives the first global input/output line GIO1 up to the internal voltage VPERI in response to the first pull-up signal PU1. The NMOS transistor N25 drives the first global input/output line GIO1 down to the ground voltage VSS in response to the first pull-down signal PD1. Here, the PMOS transistor P25 may preferably be a MOS transistor that has a relatively low threshold voltage. The PMOS transistor P25 having a low threshold voltage, as indicated with the hash marks at the gate of the PMOS transistor P25 in FIG. 4, assures sufficient current drivability even in a reading operation that is conducted under a low power voltage VDD.

Figure 5:
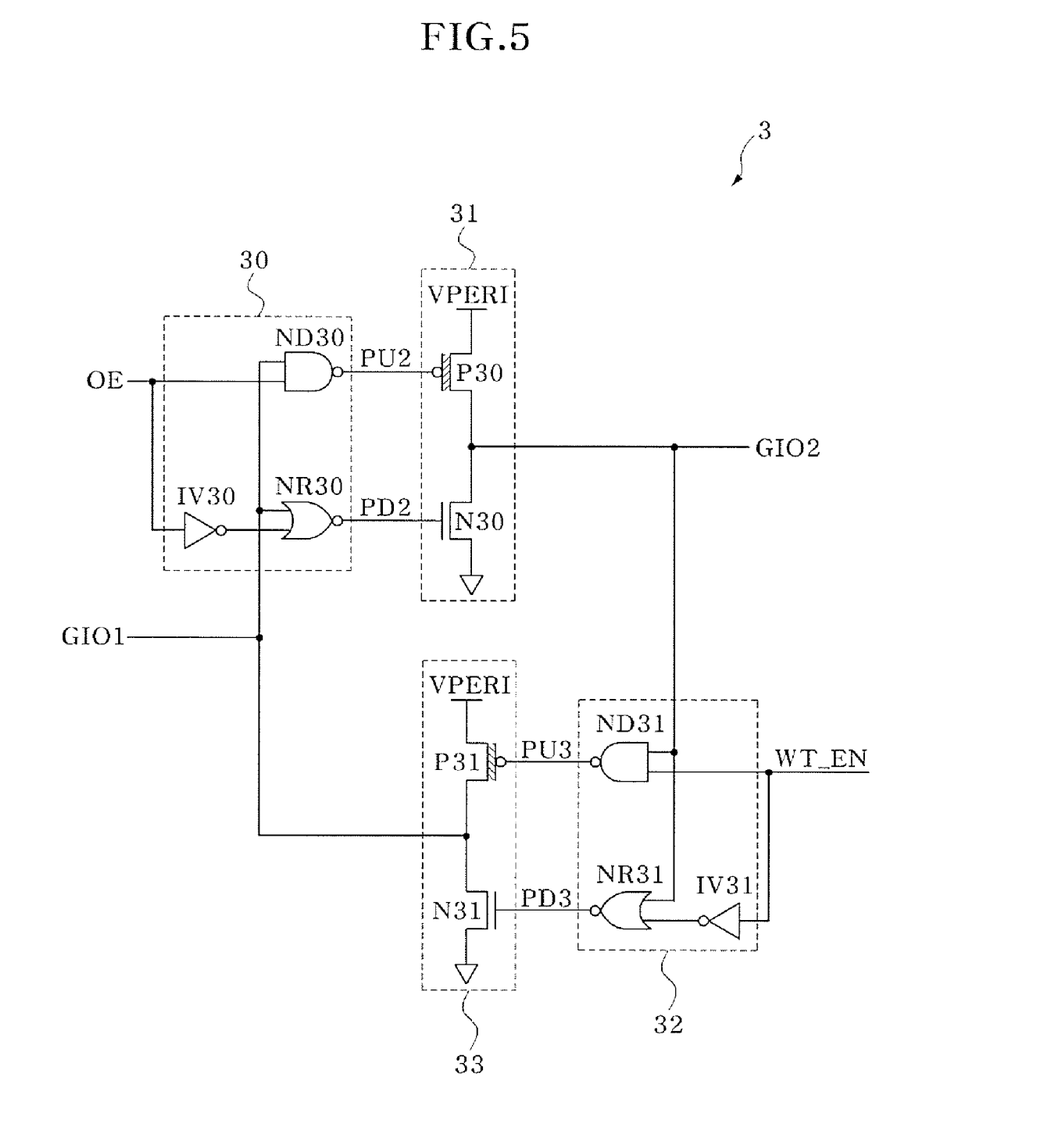
FIG. 5 is a circuit diagram illustrating the input/output line sense-amplifier driver of the data control circuit shown in FIG. 1.

Now referring to FIG. 5, the global input/output line repeater 30 may comprise a second pull-up/down signal generator 30, a second driving circuit 31, a third pull-up/down signal generator 32 and a third driving circuit 33.

The second pull-up/down signal generator 30 is exemplarily formed of a NAND gate ND30 and a NOR gate NR30. The NAND gate ND30 inverts data that is loaded on the first global input/output line GIO1, when the first enable signal OE is set on a high level state, and then transfers the inverted data as a second pull-up signal PU2. The NOR gate NR30 inverts data that is loaded on the first global input/output line GIO1, when the first enable signal OE is set on a high level state, and then transfers the inverted data as a second pull-down signal PD2.

The second driving circuit 31 may be formed of a PMOS transistor P30 and an NMOS transistor N30. The PMOS transistor P30 drives the second global input/output line GIO2 up to the internal voltage VPERI in response to the second pull-up signal PU2. The NMOS transistor N30 drives the second global input/output line GIO2 down to the ground voltage VSS in response to the second pull-down signal PD2. Here, the PMOS transistor P30 may preferably be a MOS transistor that has a relatively low threshold voltage. The PMOS transistor P30 having a low threshold voltage, as indicated with the hash marks at the gate of the PMOS transistor P30 in FIG. 5, assures sufficient current drivability even in a reading operation that is conducted under a low power voltage VDD.

The third pull-up/down signal generator 32 is exemplarily formed of a NAND gate ND31 and a NOR gate NR31. The NAND gate ND31 inverts data that is loaded on the second global input/output line GIO2, when the second enable signal WT_EN is set at a high level state, and then transfers the inverted data as a third pull-up signal PU3. The NOR gate NR31 inverts data that is loaded on the second global input/output line GIO2, when the second enable signal WT_EN is set at a high level state, and then the NOR gate NR31 transfers the inverted data as a third pull-down signal PD3.

The third driving circuit 33 may comprise a PMOS transistor P31 and an NMOS transistor N31. The PMOS transistor P31 drives the first global input/output line GIO1 up to the internal voltage VPERI in response to the third pull-up signal PU3. The NMOS transistor N31 drives the first global input/output line GIO1 down to the ground voltage VSS in response to the third pull-down signal PD3. Here, the PMOS transistor P31 may be preferably implemented as a MOS transistor that has a relatively low threshold voltage. The PMOS transistor P31 having a low threshold voltage, as indicated with the hash marks at the gate of the PMOS transistor P31 in FIG. 5, assures sufficient current drivability even in a writing operation that is conducted under a low power voltage VDD.

Figure 6:
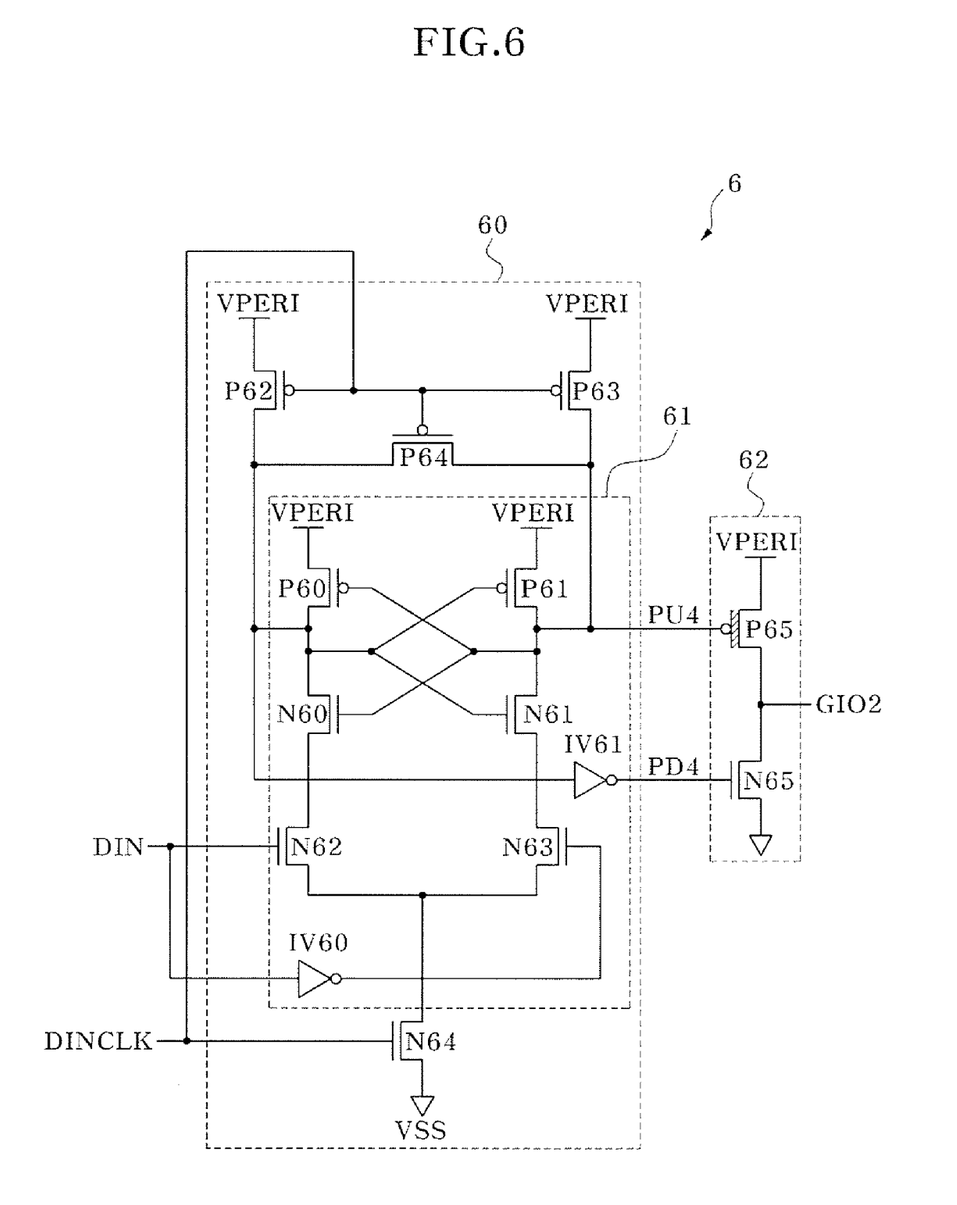
FIG. 6 is a circuit diagram illustrating the data input driver of the data control circuit shown in FIG. 1.

Next, referring to FIG. 6, the data input driver 6 may comprise a fourth pull-up/down signal generator 60 and a fourth driving circuit 62.

The fourth pull-up/down signal generator 60 is exemplarily formed of a second differential amplifier 61, PMOS transistors P62~P64, and an NMOS transistor N64. The PMOS and NMOS transistors P62~P64 and N64 function to enable the second differential amplifier 61 in response to a data input clock DINCLK. The second differential amplifier 61 may be formed of PMOS transistors, P60 and P61, and NMOS transistors N60~N63. The second differential amplifier 61 generates a fourth pull-up signal PU4 and a fourth pull-down signal PD4 by differentially amplifying data that are input through the data pad 4 and the data buffer 5. With this configuration, the second differential amplifier 61 is enabled when the data input clock DINCLK is activated at a high level state. When the data input clock DINCLK is set at a high level state, the second differential amplifier 61 generates the fourth pull-up and pull-down signals PU4 and PD4 that are activated at low level states. To the contrary, when the data input clock DINCLK is set at a low level state, the fourth pull-up and pull-down signals PU4 and PD4 are generated on high level states from the second differential amplifier 61.

The fourth driving circuit 62 may be formed of a PMOS transistor P65 and an NMOS transistor N65. The PMOS transistor P65 drives the second global input/output line GIO2 up to the internal voltage VPERI in response to the fourth pull-up signal PU4. The NMOS transistor N65 drives the second global input/output line GIO2 down to the ground voltage VSS in response to the fourth pull-down signal PD4. Here, the PMOS transistor P65 may be preferably implemented as a MOS transistor that has a relatively low threshold voltage. The PMOS transistor P65 having a low threshold voltage, as indicated with the hash marks at the gate of the PMOS transistor P65 in FIG. 6, assures sufficient current drivability even in a reading operation that is conducted under a low power voltage VDD.

Now operating sequences of the data control circuit with this configuration will be described in the cases of the reading and writing modes, and that of the standby mode when power downs.

First, in the reading operation, according as the first enable signal OE is activated to a high level state, the PMOS transistor P10 of the first global input/output line precharging circuit 10 and the PMOS transistor P11 of the second global input/output line precharging circuit 11 are all turned off. Under this condition, the IOSA driver 2 differentially amplifies data of the local input/output line LIO and the complementary local input/output line LIOB, in response to the strobe signal IOSTB, and the IOSA driver 2 then drives the first global input/output line GIO1. During this, the PMOS transistor P25 of the first driving circuit 22 included in the IOSA driver 2 drives the first global input/output line GIO1 to have sufficient current drivability because it is preferably has a MOS transistor that has a low threshold voltage. Further, responding to the first enable signal OE that is activated in a high level state, the second pull-up/down signal generator 30 amplifies data that is loaded on the first global input/output line GIO1 and then transfers the amplified data to the second global input/output line GIO2. During this, the PMOS transistor P30 of the second driving circuit 31 coupled to the second global input/output line GIO2 drives the second global input/output line GIO2 to have sufficient current drivability because it preferably has a MOS transistor that has a low threshold voltage.

As aforementioned, it can be seen that the data control circuit is helpful to enhancing an operating rate of the reading operation even under conditions of low power voltage VDD by providing the PMOS transistors P25 and P30, which are made up of MOS transistors having relatively low threshold voltages, with sufficient current drivability.

Next, in the writing operation, according as the second enable signal WT_EN is activated at a high level state, the PMOS transistor P10 of the first global input/output line precharging circuit 10 and the PMOS transistor P11 of the second global input/output line precharging circuit 11 are all turned off. Under this condition, the data input driver 6 differentially amplifies data that are input through the data pad 4 and the data buffer 5, in response to the data input clock DINCLK, and then drives the second global input/output line GIO2. During this, the PMOS transistor P65 of the fourth driving circuit 62 included in the data input driver 6 drives the second global input/output line GIO2 with sufficient current drivability because it can preferably comprise a MOS transistor that has a low threshold voltage. Further, responding to the second enable signal WT_EN that is activated in a high level state, the third pull-up/down signal generator 32 amplifies data that is loaded on the second global input/output line GIO2 and then transfers the amplified data to the first global input/output line GIO1. During this, the PMOS transistor P31 of the third driving circuit 33 coupled to the first global input/output line GIO1 drives the first global input/output line GIO1 with sufficient current drivability because it can preferably comprise a MOS transistor that has a low threshold voltage.

As aforementioned, it can be seen that the data control circuit is helpful to enhancing an operating rate of the writing operation even under low power voltage VDD conditions by providing the PMOS transistors P65 and P31, which are made up of MOS transistors having relatively low threshold voltages, with sufficient current drivability.

In the meantime, when the reading or writing operation is inoperative, e.g., during a standby mode when the power drops down, the first enable signal OE and the second enable signal WT_EN are all set on low level states. Thus, the PMOS transistor P10 of the first global input/output line precharging circuit 10 is turned on to drive the first global input/output line GIO1 at the internal voltage VPERI. And, the PMOS transistor P11 of the second global input/output line precharging circuit 11 is turned on to drive the second global input/output line GIO2 at the internal voltage VPERI. In this condition, the IOSA driver 2, the global input/output line repeater 3 and the data input driver 6, all of which are enabled in the reading or writing operation, are disabled. Here, as aforementioned relevant to the conventional case, there would have been an increasingly generated leakage currents through the PMOS transistor P25 of the IOSA driver 2, the PMOS transistors P30 and P31 of the global input/output line repeater 3, and the PMOS transistor P65 of the data input driver 6, which are made up of MOS transistors that have low threshold voltages, during the standby mode. However, the data control circuit according to this embodiment of the present invention is able to reduce these leakage currents by driving the first and second global input/output lines, GIO1 and GIO2, at the internal voltage VPERI when the reading or writing operation is inoperative.

Summarily, the data control circuit according to this embodiment is useful to substantially preventing degradation of the address access time (tAA) characteristics in a low power voltage by providing the PMOS transistors, which drive the first and second global input/output lines GIO1 and GIO2, with stable current drivability by means of relatively low threshold voltages. Additionally, the data control circuit according to this embodiment is substantially effective in reducing leakage current by precharging the first second global input/output lines GIO1 and GIO2 to the internal voltage VPERI when there is no reading or writing operations of data.

Different from the aforementioned embodiment, it is also permissible for the NMOS transistors, which are arranged to drive the first and second global input/output lines GIO1 and GIO2, to have relatively low threshold voltages. That is, low-voltage MOS transistors are available for the NMOS transistor N25 of the IOSA driver 2, the NMOS transistors N30 and N31 of the global input/output line repeater 3, and the NMOS transistor N51 of the data input driver 6.

Figure 7:
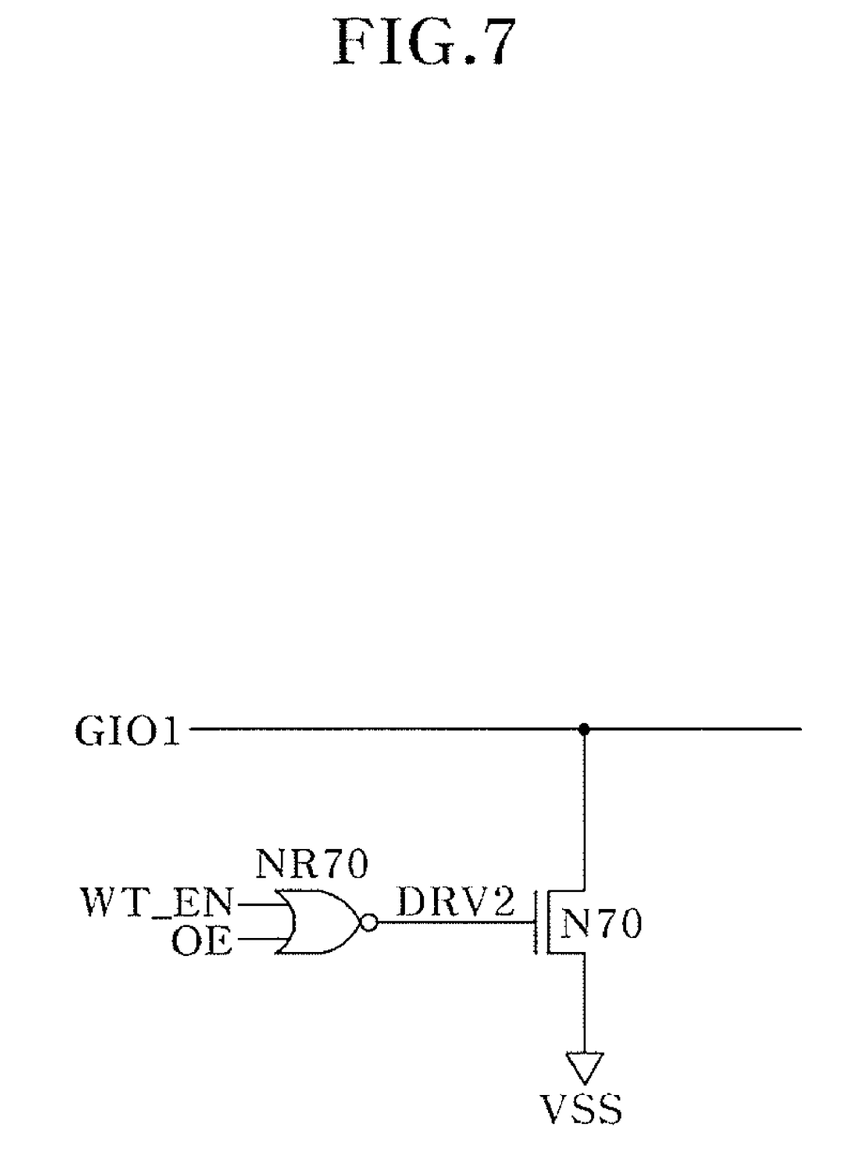
FIG. 7 is a circuit diagram illustrating another embodiment of the first and second global input/output line precharging circuits shown in FIGS. 2 and 3.

In this embodiment, the first global input/output line precharging circuit 10 shown in FIG. 2 and the second global input/output line precharging circuit 11 shown in FIG. 3 may be replaced with the circuit shown in FIG. 7. As illustrated in FIG. 7, the first global input/output line precharging circuit 10 or the second global input/output line precharging circuit 11 may be exemplarily comprised of a NOR gate NR70 and an NMOS transistor N70. The NOR gate NR70 generates a drive signal DRV in response to receiving the first enable signal OE and the second enable signal WT_EN. The NMOS transistor N70 drives the first global input/output line GIO1 down to the ground voltage VSS in response to the drive signal DRV.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this invention as defined in the claims.

What is claimed is:

1. A data control circuit comprising:
    an input/output line precharging circuit comprising: a drive signal generator configured to generate a drive signal in response to receiving a first enable signal that is activated in the reading operation and configured to generate the drive signal in response to receiving a second enable signal that is activated in the writing operation, wherein the input/output line precharging circuit is configured to precharge a global input/output line to a predetermined voltage when reading or writing operations are inoperative; and
    a driver comprising a number of MOS transistors and configured to drive the global input/output line in response to receiving data from a local input/output line and a complementary local input/output line during the reading operation, wherein at least one of the MOS transistors, which drives the global input/output line, has a threshold voltage lower than threshold voltages of the other MOS transistors; wherein the first and second enable signals are different from each other.

2. The data control circuit according to claim 1, further comprising:
    a second input/output line precharging circuit comprising: a second drive signal generator configured to generate a second drive signal in response to receiving the first enable signal and configured to generate the second drive signal in response to receiving the second enable signal, wherein the second input/output line precharging circuit is configured to precharge a second global input/output line to a predetermined voltage when reading or writing operations are inoperative; and
    a repeater configured to amplify and transfer data of the global input/output line to the second global input/output line during the reading operation and configured to amplify and transfer data of the second global input/output line to the global input/output line during the writing operation.

3. The data control circuit according to claim 2, wherein the repeater comprises:
    a first pull-up/down signal generator configured to generate first pull-up and pull-down signals from a signal of the global input/output line in response to the first enable signal;
    a first driving circuit that comprises a first pull-up element configured to pull up a signal of the second global input/output line in response to the first pull-up signal and comprises a first pull-down element configured to pull down a signal of the second global input/output line in response to the first pull-down signal;
    a second pull-up/down signal generator configured to generate second pull-up and pull-down signals from a signal of the second global input/output line in response to the second enable signal; and
    a second driving circuit that comprises a second pull-up element configured to pull up a signal of the global input/output line in response to the second pull-up signal and the second driving circuit comprises a second pull-down element configured to pull down a signal of the global input/output line in response to the second pull-down signal.

4. The data control circuit according to claim 1, wherein the drive signal generator is configured to generate the drive signal through an OR operation when responding to the first enable signal OE, and when responding to the second enable signal.

5. The data control circuit according to claim 1, wherein the drive signal generator comprises a PMOS transistor configured to be turned on to drive the global input/output line at an internal voltage in response to the first drive signal when the first drive signal is in a low level state.

6. The data control circuit according to claim 1, wherein the input/output line precharging circuit further comprises:
 a driving element configured to drive a global input/output line at an internal voltage or a ground voltage in response to the drive signal.

7. The data control circuit according to claim 1, wherein the drive signal generator is configured to enable the driving element when the first and second enable signals are activated.

8. The data control circuit according to claim 1, wherein the driver comprises:
 a differential amplifier configured to generate pull-up and pull-down signals by differentially amplifying data of the local input/output line and the complementary local input/output line; and
 a driving circuit configured to drive the global input/output line in response to receiving the pull-up and pull-down signals.

9. The data control circuit according to claim 8, wherein at least one of the MOS transistors of the driving circuit has a threshold voltage lower than threshold voltages of the other MOS transistors and is included in the differential amplifier.

10. The data control circuit according to claim 1, wherein the input/output line precharging circuit further comprises:
 a driving element configured to drive a global input/output line at an internal voltage or a ground voltage in response to the drive signal.

11. The data control circuit according to claim 1, wherein the drive signal generator is configured to enable the driving element when the first and second enable signals are activated.

12. The data control circuit according to claim 1, wherein the driver comprises:
 a differential amplifier configured to generate pull-up and pull-down signals by differentially amplifying the data; and
 a driving circuit configured to drive the global input/output line in response to receiving the pull-up and pull-down signals.

13. The data control circuit according to claim 12, wherein the driving circuit comprises a MOS transistor having a threshold voltage lower than threshold voltages of other MOS transistors included in the differential amplifier.

14. The data control circuit according to claim 8 wherein when the local input/output line is set on a high level state, the differential amplifier generates the first pull-up and pull-down signals that are activated at low level states, and when the local input/output line is set on a low level state, the differential amplifier generates the first pull-up and pull-down signals are generated on high level states.

15. The data control circuit according to claim 9, wherein the driving circuit comprises a PMOS transistor and an NMOS transistor, the PMOS transistor is configured to drive the global input/output line up to an internal voltage in response to the first pull-up signal, the NMOS transistor is configured to drive the global input/output line down to the ground voltage in response to the first pull-down signal, and the PMOS has a threshold voltage lower than the NMOS transistor which assures sufficient current drivability even in a reading operation that is conducted under a low power voltage condition.

16. The data control circuit according to claim 12 wherein when the local input/output line is set on a high level state, the differential amplifier generates the first pull-up and pull-down signals that are activated at low level states, and when the local input/output line is set on a low level state, the differential amplifier generates the first pull-up and pull-down signals are generated on high level states.

17. The data control circuit according to claim 13, wherein the driving circuit comprises a PMOS transistor and an NMOS transistor, the PMOS transistor is configured to drive the global input/output line up to an internal voltage in response to the first pull-up signal, the NMOS transistor is configured to drive the global input/output line down to the ground voltage in response to the first pull-down signal, and the PMOS has a threshold voltage lower than the NMOS transistor which assures sufficient current drivability even in a reading operation that is conducted under a low power voltage condition.

18. A data control circuit comprising:
 an input/output line precharging circuit comprising a drive signal generator configured to generate a drive signal in response to receiving a first enable signal that is activated in the reading operation and configured to generate the drive signal in response to receiving a second enable signal that is activated in the writing operation wherein the input/output line precharging circuit is configured to precharge a global input/output line at a predetermined voltage when either reading or writing operations are inoperative; and
 a driver comprising a number of MOS transistors and configured to drive the global input/output line in response to receiving data from a data pad during the writing operation, wherein at least one of the MOS transistors, which drives the global input/output line, has a threshold voltage lower than threshold voltages the other MOS transistors; wherein the first and second enable signals are different from each other.

19. The data control circuit according to claim 18, wherein the drive signal generator is configured to generate the drive signal through an OR operation when responding to the first enable signal OE, and when responding to the second enable signal.

20. The data control circuit according to claim 18, wherein the drive signal generator comprises a PMOS transistor configured to be turned on to drive the global input/output line at an internal voltage in response to the first drive signal when the first drive signal is in a low level state.

21. A data control circuit comprising:
 an input/output line precharging circuit comprising: a drive signal generator configured to generate a drive signal in response to receiving a first enable signal that is activated in the reading operation and configured to generate the drive signal in response to receiving a second enable signal that is activated in the writing operation, and a driving element configured to drive the global input/output line at an internal voltage or a ground voltage in response to the drive signal, wherein the input/output line precharging circuit is configured to precharge a global input/output line to a predetermined voltage when reading or writing operations are inoperative; and
 a driver comprising a number of MOS transistors and configured to drive the global input/output line in response to receiving data from a local input/output line and a complementary local input/output line during the reading operation, wherein at least one of the MOS transistors, which drives the global input/output line, has a threshold voltage lower than threshold voltages of the other MOS transistors; wherein the first and second enable signals are different from each other.

22. The data control circuit according to claim 21, wherein the drive signal generator is configured to enable the driving element when the first and second enable signals are activated.

23. The data control circuit according to claim 21, wherein the driver comprises:

a differential amplifier configured to generate pull-up and pull-down signals by differentially amplifying data of the local input/output line and the complementary local input/output line; and a driving circuit configured to drive the global input/output line in response to receiving the pull-up and pull-down signals.

24. The data control circuit according to claim 23, wherein at least one of the MOS transistors of the driving circuit has a threshold voltage lower than threshold voltages of the other MOS transistors and is included in the differential amplifier.

25. A data control circuit comprising:

an input/output line precharging circuit comprising a drive signal generator configured to generate a drive signal in response to receiving a first enable signal that is activated in the reading operation and configured to generate the drive signal in response to receiving a second enable signal that is activated in the writing operation, and a driving element configured to drive the global input/output line at an internal voltage or a ground voltage in response to the drive signal, wherein the input/output line precharging circuit is configured to precharge a global input/output line at a predetermined voltage when either reading or writing operations are inoperative; and a driver comprising a number of MOS transistors and configured to drive the global input/output line in response to receiving data from a data pad during the writing operation, wherein at least one of the MOS transistors, which drives the global input/output line, has a threshold voltage lower than threshold voltages the other MOS transistors; wherein the first and second enable signals are different from each other.

26. The data control circuit according to claim 25, wherein the drive signal generator is configured to enable the driving element when the first and second enable signals are activated.

27. The data control circuit according to claim 25, wherein the driver comprises:

a differential amplifier configured to generate pull-up and pull-down signals by differentially amplifying the data; and a driving circuit configured to drive the global input/output line in response to receiving the pull-up and pull-down signals.

28. The data control circuit according to claim 27, wherein the driving circuit comprises a MOS transistor having a threshold voltage lower than threshold voltages of other MOS transistors included in the differential amplifier.

* * * * *